United States Patent [19]

Inoue et al.

[11] Patent Number: 5,266,416
[45] Date of Patent: Nov. 30, 1993

[54] ALUMINUM-STABILIZED SUPERCONDUCTING WIRE

[75] Inventors: Itaru Inoue; Yoshinori Nagasu; Keizo Kosugi; Takuya Suzuki, all of Tokyo, Japan

[73] Assignee: The Furukawa Electric Co., Ltd., Tokyo, Japan

[21] Appl. No.: 834,003

[22] Filed: Feb. 11, 1992

[30] Foreign Application Priority Data

Feb. 20, 1991 [JP] Japan ................. 3-47677
May 8, 1991 [JP] Japan ................. 3-133542
Jun. 26, 1991 [JP] Japan ................. 3-181920
Jun. 26, 1991 [JP] Japan ................. 3-181921

[51] Int. Cl.$^5$ ...................... H01L 39/12; H01B 12/02
[52] U.S. Cl. ...................... 428/651; 428/652; 428/930; 505/812; 505/921
[58] Field of Search ............ 428/614, 660, 651, 652, 428/930; 29/599; 148/96; 505/812, 813, 814, 921, 928, 929, 930

[56] References Cited

U.S. PATENT DOCUMENTS

| | | | |
|---|---|---|---|
| 3,974,055 | 8/1976 | Reding et al. | 420/540 |
| 4,109,374 | 8/1978 | Whetstone et al. | 505/928 |
| 4,242,536 | 12/1980 | Young | 505/877 |
| 4,285,120 | 8/1981 | Nomura et al. | 505/930 |
| 4,537,642 | 8/1985 | Saito et al. | 29/599 |
| 4,659,007 | 4/1987 | Onishi et al. | 505/927 |
| 4,673,774 | 6/1987 | Wake et al. | 505/887 |
| 4,757,161 | 7/1988 | Wilhelm et al. | 29/599 |
| 4,917,965 | 4/1990 | Inoue et al. | 428/614 |
| 4,982,497 | 1/1991 | Mier | 428/614 |

FOREIGN PATENT DOCUMENTS

| | | |
|---|---|---|
| 57-145957 | 9/1982 | Japan . |
| 61-227306 | 10/1986 | Japan . |
| 61-231143 | 10/1986 | Japan . |
| 62-51112 | 3/1987 | Japan . |
| 2132002 | 6/1984 | United Kingdom . |

*Primary Examiner*—John Zimmerman
*Attorney, Agent, or Firm*—Frishauf, Holtz, Goodman & Woodward

[57] ABSTRACT

An aluminum-stabilized superconducting wire includes a superconducting wire member obtained by burying a superconducting filament in a copper matrix and an aluminum stabilizing member covered in an outer surface of the superconducting wire member, and the aluminum stabilizing member is constituted by an aluminum alloy having a 0.2 % proof resistivity of 4 kg/mm$^2$ or more at a very low temperature and a residual resistance ratio of 250 or more. It is preferable that the aluminum alloy contains at least one element selected from 50 to 1,000 ppm of Zn, 50 to 150 ppm of Si, 50 to 400 ppm of Ag, 50 to 300 ppm of Cu, and 30 to 2,000 ppm of Ce, and that a balance is constituted by Al and an inevitable impurity.

14 Claims, 2 Drawing Sheets

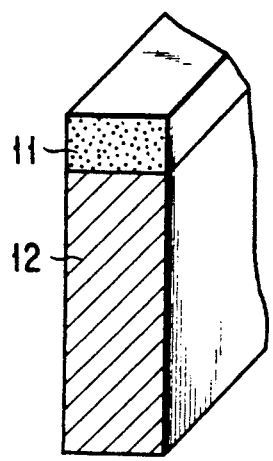
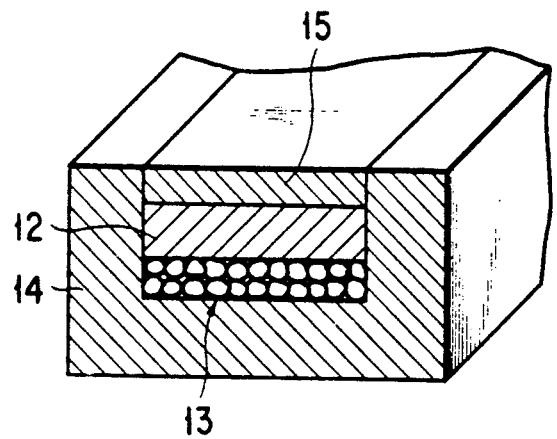
FIG. 1A          FIG. 1B
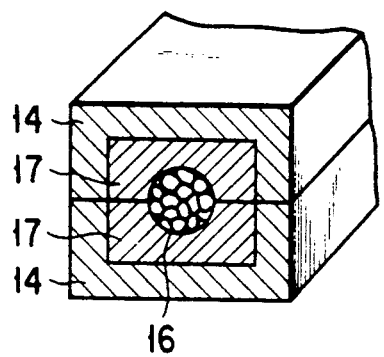
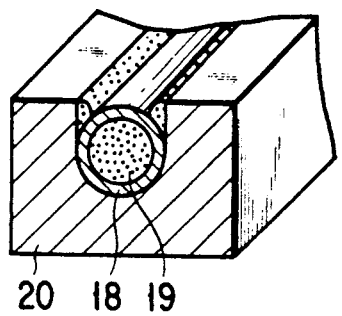
FIG. 1C          FIG. 1D
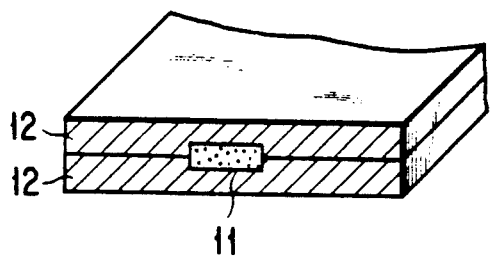
FIG. 1E

ALUMINUM-STABILIZED SUPERCONDUCTING WIRE

BACKGROUND OF THE INVENTION

1. Field of the Invention

The present invention relates to an aluminum-stabilized superconducting wire excellent in mechanical strength, thermal stability, and electrical stability and suitable as a conductor of a magnet.

2. Description of the Related Art

Conventionally, a superconducting wire obtained by burying a superconducting filament made of, e.g., Nb-Ti in a copper matrix is used as a conductor of a superconducting magnet or the like.

This superconducting wire is fabricated, e.g., in the following manner. An Nb-Ti alloy rod is inserted in a copper pipe or copper alloy pipe to form a composite billet. The composite billet is hot-extruded to be integrated. The integrated composite billet is then subjected to rolling and drawing, e.g., wire drawing. A multi-core superconducting wire is obtained by filling a multiple of resultant superconducting wires in a copper pipe to form a composite billet, and subjecting the composite billet to the processing as described above. When a necessary number of superconducting wires or multi-core superconducting wires thus obtained are intertwined, a stranded superconducting wire can be fabricated.

An aluminum-stabilized superconducting wire is obtained by covering the superconducting wire or stranded superconducting wire described above with high-purity aluminum as a stabilizing member having a residual resistance ratio (a ratio of an electric resistance at 300K to an electric resistance at 100K) much higher than that of copper. The aluminum-stabilized superconducting wire is excellent in thermal stability and electrical stability when compared to a conventional copper-stabilized superconducting wire to which only copper is covered as the stabilizing member. In addition, since the specific gravity of aluminum is ⅓ that of copper, when the superconducting wire is used in the magnet, the weight and size of the magnet can be reduced. Since the aluminum has a smaller mass than that of copper and thus has an excellent elementary particle permeability, an application of the aluminum-stabilized superconducting wire to a magnet for elementary particle detector has been studied in the field of high energy physics.

However, since high-purity aluminum of the aluminum-stabilized superconducting wire as the stabilizing member has a low mechanical strength, when the aluminum-stabilized superconducting wire is used as a conductor of a large magnet, it can be deformed by the electromagnetic force.

SUMMARY OF THE INVENTION

It is an object of the present invention to provide an aluminum-stabilized superconducting wire which is excellent in thermal stability and electrical stability and can exhibit a sufficient mechanical strength against a generated electromagnetic force when used in a magnet.

This object can be achieved by an aluminum-stabilized superconducting wire having: a superconducting wire member obtained by burying a superconducting filament in a copper matrix; and an aluminum stabilizing member covered on an outer surface of the superconducting wire member, wherein the aluminum stabilizing member is constituted by an aluminum alloy having a 0.2% proof strength of not less than 4 kg/mm$^2$ at a very low temperature and a residual resistance ratio of not less than 250.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A, 1B, 1C, 1D and 1E are cross-sectional views showing arrangements of an aluminum-stabilized superconducting wire according to embodiments of the present invention.

DETAILED DESCRIPTION OF THE PREFERRED EMBODIMENTS

Figure 2:
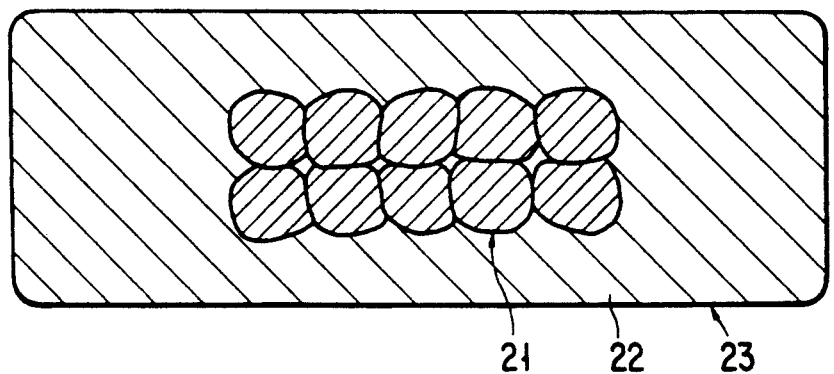
FIGS. 2 and 3 are cross-sectional views showing arrangements of the aluminum-stabilized superconducting wire according to the embodiments of the present invention.

The present inventors conducted extensive studies on an aluminum-stabilized superconducting wire in response to a request from National Laboratory for High Energy Physics, and found Zn, Si, Ag, Cu, and Ce as alloy elements which improved the mechanical strength of the aluminum-stabilized superconducting wire without decreasing the conductivity of aluminum, thus achieving the present invention.

An aluminum-stabilized superconducting wire according to the present invention uses an aluminum alloy as an aluminum stabilizing member having a high mechanical strength with the 0.2% proof strength being 4 kg/mm$^2$ or more at a very low temperature. Therefore, even when it is used as a conductor of a large magnet, it will not be deformed by the electromagnetic force. Since the residual resistance ratio of the aluminum alloy is limited to 250 or more, which corresponds to the specific resistance of a conventional copper stabilizing member at the very low temperature, the obtained aluminum stabilizing superconducting wire is stabilized both thermally and electrically. Furthermore, when the aluminum alloy containing a small amount of alloy element as described above is subjected to predetermined cold working, an aluminum stabilizing member can be easily manufactured.

According to the present invention, the 0.2% proof strength at the very low temperature of the aluminum alloy used in the aluminum stabilizing member for covering the superconducting wire or stranded superconducting wire is limited to 4 kg/mm$^2$ or more due to the following reason. That is, if the 0.2% proof strength at the very low temperature is less than 4 kg/mm$^2$, when the obtained aluminum-stabilized superconducting wire is used as a conductor of a large magnet, the aluminum-stabilized superconducting wire is deformed by the electromagnetic force.

The residual resistance ratio of the aluminum alloy used in the aluminum stabilizing member is limited to 250 or more because if it is less than 250, sufficient thermal stability and electrical stability cannot be obtained. In a conventional copper-stabilized superconducting wire, the residual resistance ratio of copper as the stabilizing member is normally set to 150, i.e., a specific resistance of $1.1 \times 10^{-8}$ $\Omega$·cm at 10K. In the case of the aluminum alloy, the residual resistance ratio corresponding to the specific resistance of $1.1 \times 10^{-8}$ $\Omega$·cm at 10K is 250. Therefore, the thermal stability and electrical stability of the aluminum-stabilized superconducting wire according to the present invention are equal to or better than those of the conventional copper-stabilized superconducting wire.

An example of the aluminum alloy satisfying the 0.2% proof strength and the residual resistance ratio regulated by the present invention includes, e.g., a two-element aluminum alloy aluminum such as an Al-Zn alloy containing 50 to 1,000 ppm of Zn and a balance constituted by Al, an Al-Si alloy containing 50 to 150 ppm of Si and a balance constituted by Al, an Al-Ag alloy containing 50 to 400 ppm of Ag and a balance constituted by Al, an Al-Cu alloy containing 50 to 300 ppm of Cu and a balance constituted by Al, and an Al-Ce alloy containing 30 to 2,000 ppm of Ce and a balance constituted by Al; and a multi-element alloy containing at least two elements selected from Zn, Si, Ag, Cu, and Ce in the contents described above. That is, according to the present invention, any aluminum alloy can be used as far as it has a 0.2% proof strength of 4 kg/mm$^2$ at very low temperature and a residual resistance ratio of 250 or more. The content of the additional element is limited to above range due to the following reason. That is, if the content is less than the low limit, obtained superconducting wire cannot exhibit sufficient strength. If the content is more than the high limit, the residual resistance ratio of aluminum alloy is degraded. In this case, an aluminum alloy is preferable which contains at least one of 50 to 1,000 ppm of Zn and 50 to 400 ppm of Ag; 10 to 50 ppm of Si and 10 to 50 ppm of Cu, or 10 to 50 ppm of Si+Cu; and a balance constituted by Al. A superconducting wire is formed into a magnet, and the magnet may be impregnated with a resin, e.g., an epoxy resin so that the wire will not be moved by the electromagnetic force generated by the magnetic field and transport current. Alternatively, a precured epoxy resin tape is wound onto the superconducting wire, and is hardened by subjecting it to the heat treatment. In this case, the magnet is heated at 100° to 150° C. for 10 to 30 hours in order to cure the resin. The magnet is softened by this heating process and its mechanical strength, e.g., the 0.2% proof strength is decreased. When 10 to 50 ppm of Si and 10 to 50 ppm of Cu, or 10 to 50 ppm of Si+Cu are contained in the magnet as the alloy elements, in addition to the Zn and/or Ag, as described above, the softening temperature of the magnet is increased. In this case, if the content of Si and/or Cu is less than the low limit, the effect by increasing the softening temperature is not exhibited sufficiently. If the content is more than the high limit, the residual resistance ratio of aluminum alloy is degraded. Any of these aluminum alloys is of a solid solution in which alloy elements are contained in an aluminum matrix.

The aluminum-stabilized superconducting wire according to the present invention is obtained by covering a superconducting wire or stranded superconducting wire with an aluminum alloy by integral hot extrusion to form an annealed wire member, or drawing the aluminum-covered extruded member described above to a predetermined shape and annealing it at a temperature higher than a recrystallization temperature to form an annealed wire member, and cold-working the annealed wire member with an area reduction rate of 3 to 60%. Alternatively, an aluminum alloy member obtained by cold-working an aluminum alloy with an area reduction rate of 3 to 60% may be composed with a superconducting wire or stranded superconducting wire. An arbitrary process, e.g., rolling, drawing, swaging, or the like can be adopted for cold working or drawing.

Other than the above methods, an arbitrary composite method, e.g., soldering or mechanical bonding can be adopted as a method of composing an aluminum alloy member subjected to the cold working with a superconducting wire or stranded superconducting wire. For example, an aluminum-stabilized superconducting wire shown in FIG. 1A is obtained by composing an aluminum stabilizing member 12 with a multi-core Cu/NbTi superconducting wire 11 by soldering. An aluminum-stabilized superconducting wire shown in FIG. 1B is obtained by composing an aluminum stabilizing member 12 with a Cu/NbTi stranded superconducting wire 13 by soldering, placing the composite body in a copper stabilizing member 14 having a substantially U-shaped section and soldering, and mounting a plate-shaped copper stabilizing member 15 on an exposed surface of the aluminum stabilizing member 12 by soldering. An aluminum-stabilized superconducting wire shown in FIG. 1C is obtained by soldering two aluminum stabilizing members 17 each having a semicircular groove with a Cu/NbTi stranded superconducting wire 16 having a circular section by fitting, and covering the soldered composite body with two copper stabilizing members 14 each having a substantially U-shaped section by soldering. An aluminum-stabilized superconducting wire shown in FIG. 1D is obtained by fitting and soldering a Cu/Nb$_3$Sn superconducting wire 19 covered with a copper stabilizing member 18 in a groove of an aluminum stabilizing member 20. An aluminum-stabilized superconducting wire shown in FIG. 1E is obtained by placing two aluminum stabilizing members 12 each having a rectangular groove on a multi-core Cu/NbTi superconducting wire 11 such that the Cu/NbTi superconducting wire 11 is fitted in the grooves, and rolling and contact-bonding the entire structure.

According to the present invention, when the aluminum alloy is composed with a superconducting wire or a stranded superconducting wire, copper or a copper alloy can be composed in place of the aluminum alloy.

In the above description, the area reduction rate of cold working to be performed for the annealed wire is limited to 3 to 60% due to the following reason. If the area reduction rate is less than 3%, a 0.2% proof strength of 4 kg/mm$^2$ or more cannot be obtained, and the aluminum-stabilized superconducting wire is deformed in a high magnetic field. If the area reduction exceeds 60%, the residual resistance ratio is decreased to less than 250, and the thermal stability and electrical stability of the aluminum-stabilized superconducting wire are degraded.

The present invention will be described in more detail by way of its examples.

EXAMPLE 1

1,200 single-core superconducting wires, each obtained by burying an Nb-Ti alloy wire member in a copper matrix, were filled in an oxygen-free copper pipe having outer and inner diameters of 240 mm and 200 mm, respectively, to form a composite billet. The composite billet was subjected to hot extrusion to form a composite extruded member. The composite extruded member was rolled and pultruded to form a multi-core Nb-Ti superconducting wire member having an outer diameter of 12 mm. The multi-core Nb-Ti superconducting wire member was subjected to wire drawing and aging to form a strand having a diameter of 3.2 mm. This stranded was covered with an aluminum two-element alloy obtained by adding a small amount of any one element selected from Cu, Si, Ag, Zn, and Ce to aluminum having a purity of 99.9993%, as a stabilizing member by hot extrusion to form an aluminum-covered rod having an outer diameter of 25 mm. Each of the rods thus obtained was subjected to rolling and wire drawing to form a drawn wire member having an outer diameter of 2.1 mm. The drawn wire member was annealed at 300° C. for 1 hour to recrystallize the aluminum alloy of the aluminum stabilizing member, thus forming an annealed wire member, and was then subjected to wire drawing to form an aluminum-stabilized superconducting wire (Nos. 1 to 15) having an outer diameter of 2.0 mm.

The contents of the alloy elements of the two-element aluminum alloy were variously changed within a range of 50 to 300 ppm of Cu, 50 to 150 ppm of Si, 50 to 400 ppm of Ag, 50 to 1,000 ppm of Zn, and 30 to 2,000 of Ce.

COMPARATIVE EXAMPLE 1

An aluminum-stabilized superconducting wire (Nos. 16 to 25) was obtained by following the procedures as in Example 1 except that the contents of alloy elements of the two-element aluminum alloy as the stabilizing member was set to fall outside the range of the present invention, i.e., a Cu content was set to less than 50 ppm or more than 300 ppm, an Si content wa set to less than 50 ppm or more than 150 ppm, an Ag content was set to less than 50 ppm or more than 400 ppm, a Zn content was set to less than 50 ppm or more than 1,000 ppm, and a Ce content was set to less than 30 ppm or more than 2,000 ppm.

COMPARATIVE EXAMPLE 2

An aluminum-stabilized superconducting wire (No. 26) was obtained by following the same procedures as in Example 1 except that high-purity aluminum having a purity of 99.9993% was used as the stabilizing member.

A critical current value (to be referred to as Ic hereinafter), a quench current and a maximum magnetic field as the magnet characteristics, a 0.2% proof strength at 4.2K, and a residual resistance ratio of each aluminum-stabilized superconducting wire (Nos. 1 to 26) obtained in the above manner were examined. Table 1 shows the results. Note that Ic was expressed by a current value, which was obtained when an obtained aluminum-stabilized superconducting wire was formed into a short wire having a length of 1 m, a current was supplied to this short wire in liquid He (4.2 K) in an electric field of 5 T, and the specific resistance reached $10^{-11}$ Ω·cm by gradually increasing the current. Regarding the quench current and the maximum magnetic field, a magnet was fabricated by winding the obtained aluminum-stabilized superconducting wire on a coil having inner and outer diameters of 20 mm and 70 mm, respectively, the quench current was checked by measuring the current of the magnet in broken-superconducting state, and the maximum magnetic field was measured by the hall element. Note that the magnet was designed to generate a magnetic field of 8 T when it was powered at 276 A.

TABLE 1

| No. | | Alloy Element (ppm) | | 0.2% Proof Strength (kg/mm$^2$) | Residual Resistance Ratio | Ic (A) | Quench Current (A) | Maximum Magnetic Field (T) |
|---|---|---|---|---|---|---|---|---|
| Sample | 1 | Cu | 50 | 5.2 | 750 | 275 | 279 | 8.08 |
| of | 2 | | 150 | 6.2 | 400 | 273 | 277 | 8.02 |
| Present | 3 | | 300 | 7.0 | 260 | 276 | 280 | 8.12 |
| sent | 4 | Si | 50 | 5.4 | 500 | 277 | 279 | 8.08 |
| Invention | 5 | | 100 | 5.9 | 280 | 274 | 276 | 8.00 |
| tion | 6 | | 150 | 6.2 | 250 | 276 | 280 | 8.12 |
| | 7 | Ag | 50 | 4.9 | 950 | 275 | 281 | 8.14 |
| | 8 | | 200 | 6.3 | 440 | 278 | 283 | 8.20 |
| | 9 | | 400 | 7.2 | 270 | 274 | 280 | 8.12 |
| | 10 | Zn | 50 | 4.2 | 980 | 273 | 282 | 8.17 |
| | 11 | | 500 | 7.0 | 620 | 277 | 281 | 8.14 |
| | 12 | | 1000 | 8.0 | 260 | 278 | 283 | 8.20 |
| | 13 | Ce | 30 | 5.1 | 1030 | 272 | 280 | 8.11 |
| | 14 | | 1000 | 7.8 | 980 | 275 | 281 | 8.14 |
| | 15 | | 2000 | 8.3 | 260 | 273 | 279 | 8.08 |
| Sample | 16 | Cu | 20 | 1.8 | 980 | 278 | 222 | 6.43 |
| of | 17 | | 350 | 7.4 | 200 | 272 | 230 | 6.67 |
| Comparison | 18 | Si | 20 | 2.1 | 920 | 276 | 224 | 6.49 |
| ison | 19 | | 200 | 6.6 | 190 | 277 | 245 | 7.10 |
| Example | 20 | Ag | 20 | 2.1 | 1100 | 275 | 219 | 6.35 |
| | 21 | | 500 | 7.5 | 180 | 278 | 231 | 6.70 |
| | 22 | Zn | 20 | 1.5 | 1300 | 274 | 235 | 6.81 |
| | 23 | | 1200 | 8.2 | 230 | 279 | 242 | 7.01 |
| | 24 | Ce | 20 | 3.5 | 1300 | 274 | 240 | 6.95 |
| | 25 | | 2200 | 8.4 | 220 | 272 | 245 | 7.09 |
| | 26 | Pure Al | | 1.0 | 2340 | 278 | 210 | 6.09 |

As is apparent from Table 1, regarding each aluminum-stabilized superconducting wire (Nos. 1 to 15) of the present invention, although its Ic was equal to that of the comparative examples (Nos. 16 to 26), its magnet characteristic was good with the maximum generated magnetic field exceeding 8 T, and its quench current had a large value of 270 A or more.

In contrast to this, in any one of samples of Comparative Examples Nos. 16, 18, 20, 22, and 24, the alloy element content of each aluminum alloy used in the aluminum stabilizing member was small, and in the sample of the Comparative Example No. 26, high-purity aluminum was used. Therefore, any of these samples had a low mechanical strength. As a result, the sample was deformed when the magnetic field generated by the magnet was 6 to 7 T, and heat generated by deformation caused quenching before a predetermined current value was reached. In Comparative Examples Nos. 17, 19, 21, 23, and 25, since the alloy element content of each aluminum alloy used in the aluminum stabilizing member was excessively large, the residual resistance ratio became small, and the thermal stability and electrical stability as the conductor were degraded to degrade the magnet characteristics.

EXAMPLE 2

Ten Cu/Nb-Ti superconducting wires (500 24 μm-diameter Nb-Ti cores; Cu/Nb-Ti ratio: 1) each having a diameter of 0.76 mm were intertwined to form a stranded wire. An Al-Zn alloy was hot-extruded to cover the stranded wire as the stabilizing member, thus forming an annealed wire member having a sectional size of 2.9 mm×32 mm. Each annealed wire member was cold-pultruded through a die having a die half angle of 3° to form an aluminum-stabilized superconducting wire 23 (Nos. 27 to 30, 34, and 35) shown in FIG. 2 in which an aluminum stabilizing member 22 covers the outer circumferential surface of the stranded superconducting wire 21. An aluminum alloy obtained by adding 200 ppm of Zn to high-purity aluminum having a purity of 99.9996% was used as the Al-Zn alloy. The pultrusion rate was variously changed.

Figure 3:
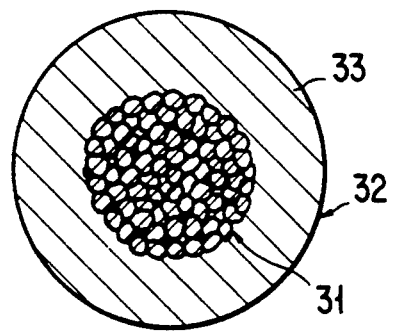

On the other hand, an Al-Zn alloy was hot-extruded to cover a Cu/Nb-Ti superconducting wire (3,000 15 μm-diameter Nb Ti cores, Cu/Nb-Ti rate: 1) having a diameter of 1.2 mm as a stabilizing member to form an extrusion wire member having an outer diameter of 8 mm. Each extrusion wire member was wire-drawn to form a wire member having an outer diameter of 2.5 mm. This wire member was annealed at 300° C. for 1 hour to form an annealed wire member. This aluminum-covered wire member was subjected to cold wire drawing to form an aluminum-stabilized superconducting wire 33 (Nos. 31 to 33, 36, and 37) shown in FIG. 3 in which an aluminum stabilizing member 32 covers the outer circumferential surface of a superconducting wire 31. An aluminum obtained by adding 800 ppm of Zn to high-purity aluminum having a purity of 99.9996% was used as the Al-Zn alloy. The wire drawing rate was variously changed.

A 0.2% proof strength at 4.2K and a residual resistance ratio of each aluminum-stabilized superconducting wire (Nos. 27 to 37) obtained in the above manner were examined. Table 2 shows the results.

TABLE 2

|  |  | Aluminum-stabilized Superconducting wire | | Aluminum Stabilizing Member | | |
|---|---|---|---|---|---|---|
| No. | | Size (mm) Thickness × Length or Outer Diameter | Area Reduction Rate (%) | Alloy Element (ppm) | 0.2% Proof Strength (Kg/mm²) | Residual Resistance Ratio |
| Sample | 27 | 2.9 × 31.0 | 3 | Zn 200 | 4.0 | 950 |
| of | 28 | 2.7 × 31.0 | 9 | Zn 200 | 5.5 | 600 |
| Present | 29 | 1.85 × 31.0 | 38 | Zn 200 | 7.3 | 410 |
| Inven- | 30 | 1.95 × 20.9 | 56 | Zn 200 | 9.3 | 260 |
| tion | 31 | 2.46 φ | 3 | Zn 800 | 4.6 | 770 |
|  | 32 | 2.3 φ | 15 | Zn 800 | 8.0 | 260 |
|  | 33 | 2.0 φ | 36 | Zn 800 | 9.0 | 250 |
| Sample | 34 | 2.9 × 31.1 | 2 | Zn 200 | 2.1 | 1160 |
| of | 35 | 1.70 × 18.9 | 64 | Zn 200 | 9.3 | 220 |
| Compara- | 36 | 2.48 φ | 2 | Zn 800 | 3.8 | 520 |
| tive Example | 37 | 1.50 φ | 64 | Zn 800 | 9.4 | 200 |

As is apparent from Table 2, in the aluminum-stabilized superconducting wires (Nos. 27 to 33) according to the present invention, the aluminum stabilizing members had the 0.2% proof strength of 4 kg/cm² or more at a very low temperature and a residual resistance ratio of 250 or more. When a magnet was assembled using each aluminum-stabilized superconducting wire, it was confirmed that a designed magnetic field was obtained.

In contrast to this, in Comparative Examples 34 and 36, since the area reduction rate of each aluminum stabilizing member was excessively small, the 0.2% proof strength was degraded to degrade the entire strength. In Comparative Examples 35 and 37, since the area reduction rate of each aluminum stabilizing member was excessively large, the residual resistance ratio was degraded to degrade the thermal stability and electrical stability. Therefore, any of these products was inappropriate as a conductor of a magnet.

EXAMPLE 3

An aluminum stabilizing member having a sectional size of 2×8 mm was soldered on a multi-core Cu/NbTi superconducting wire (Cu ratio: 1) having a sectional size of 1×2 mm obtained by burying 1,200 NbTi filaments each having a diameter of 20 μm in a Cu matrix, thus forming each aluminum-stabilized superconducting wire (Nos. 38 to 82) having a shape shown in FIG. 1A. As the aluminum stabilizing member of this aluminum-stabilized superconducting wire, an aluminum alloy member obtained by cold-working an aluminum alloy containing a small amount of at least one alloy element selected from Zn, Cu, Si, and Ag by variously changing the processing rate was used. A high-purity aluminum member having a purity of 99.999% was also used for the sake of comparison.

A 0.2% proof strength at 4.2K, a residual resistance ratio, and a maximum magnetic field generated in the magnet of each aluminum-stabilized superconducting wire obtained in the above manner were examined in the same manner as in Example 1. Table 3 shows the results.

As is apparent from Table 3, in any of the aluminum-stabilized superconducting wires (Nos. 38 to 65) according to the present invention, the maximum magnetic field exceeded a rated value of 8 T.

In contrast to this, in each of Comparative Examples Nos. 66, 70, 74, and 78, the area reduction rate was small, in each of Comparative Examples Nos. 68, 72, 76, and 80, the alloy element content of the aluminum alloy member used in the aluminum stabilizing member was small, and in Comparative Example No. 82, high-purity aluminum was used. Therefore, the mechanical strength was low, and when the obtained sample was used in a magnet, the magnet was deformed when the generated magnetic field was 6 to 7 T. Quenching occurred by heat generated by this deformation before a predetermined current value was reached. In each of Comparative Examples Nos. 67, 71, 75, and 79, the area reduction rate was excessively large, and in each of in Comparative Examples Nos. 69, 73, 77, and 81, the alloy element content of the aluminum alloy member used in the aluminum stabilizing member was excessively large. Therefore, the residual resistance ratio was small in any of these samples, the thermal stability and electrical stability of the conductor were degraded to cause quenching, and the magnet characteristics were degraded.

EXAMPLE 4

Aluminum-stabilized superconducting wires (Nos. 83 to 100) were obtained by following the procedures as in Example 1 except that the alloy element contents of the aluminum alloy members used in the aluminum stabilizing members were set as shown in Table 4, a heating process of 130° C.×15 hour was added, and the area reduction rate was set to 15%.

A 0.2% proof strength at 4.2K, a residual resistance ratio, and a maximum magnetic field generated in the magnet of each aluminum-stabilized superconducting wire obtained in the above manner were examined following the same procedures as in Example 1. Table 4 shows the results.

TABLE 3

| | No. | Alloy Element | (ppm) | Area Reduction Rate (%) | 0.2% Proof Strength (kg/mm²) | Residual Resistance Ratio | Maximum Magnetic Field (T) |
|---|---|---|---|---|---|---|---|
| Sample of Present Invention | 38 | Zn | 200 | 3 | 4.2 | 810 | 8 or more |
| | 39 | | 200 | 15 | 6.5 | 520 | 8 or more |
| | 40 | | 200 | 60 | 8.9 | 250 | 8 or more |
| | 41 | | 50 | 15 | 4.3 | 960 | 8 or more |
| | 42 | | 600 | 15 | 7.4 | 580 | 8 or more |
| | 43 | | 1000 | 15 | 8.3 | 260 | 8 or more |
| | 44 | Si | 100 | 3 | 4.7 | 390 | 8 or more |
| | 45 | | 100 | 15 | 6.0 | 320 | 8 or more |
| | 46 | | 100 | 60 | 8.2 | 260 | 8 or more |
| | 47 | | 50 | 15 | 5.8 | 380 | 8 or more |
| | 48 | | 150 | 15 | 6.3 | 290 | 8 or more |
| | 49 | Ag | 100 | 3 | 4.1 | 450 | 8 or more |
| | 50 | | 100 | 15 | 5.8 | 380 | 8 or more |
| Sample of Present Invention | 51 | Ag | 100 | 60 | 8.7 | 280 | 8 or more |
| | 52 | | 50 | 15 | 5.4 | 440 | 8 or more |
| | 53 | | 20 | 15 | 6.5 | 300 | 8 or more |
| | 54 | | 400 | 15 | 7.3 | 250 | 8 or more |
| | 55 | Cu | 100 | 3 | 4.3 | 510 | 8 or more |
| | 56 | | 100 | 15 | 6.3 | 390 | 8 or more |
| | 57 | | 100 | 60 | 6.5 | 380 | 8 or more |
| | 58 | | 50 | 15 | 5.3 | 740 | 8 or more |
| | 59 | | 200 | 15 | 6.0 | 370 | 8 or more |
| | 60 | | 300 | 15 | 7.2 | 250 | 8 or more |
| | 61 | Zn 200, Si 100 | | 15 | 7.5 | 290 | 8 or more |
| | 62 | Zn 200, Ag 100 | | 15 | 7.6 | 390 | 8 or more |
| Sample of Present Invention | 63 | Zn 200, Cu 100 | | 15 | 7.5 | 350 | 8 or more |
| | 64 | Ag 100, Cu 100 | | 15 | 6.8 | 410 | 8 or more |
| | 65 | Ag 100, Si 100 | | 15 | 6.9 | 350 | 8 or more |
| Sample of Comparative Example | 66 | Zn | 200 | 2 | 3.6 | 1160 | 6.4 |
| | 67 | | 200 | 70 | 8.6 | 240 | 6.7 |
| | 68 | | 40 | 15 | 3.5 | 1080 | 6.9 |
| | 69 | | 1100 | 15 | 9.2 | 190 | 7.1 |
| | 70 | Si | 100 | 2 | 3.5 | 650 | 6.8 |
| | 71 | | 100 | 70 | 8.9 | 215 | 6.5 |
| | 72 | | 40 | 15 | 5.6 | 470 | 6.4 |
| | 73 | | 200 | 15 | 6.8 | 170 | 7.2 |
| | 74 | Ag | 100 | 2 | 3.1 | 1200 | 6.4 |
| Sample of Comparative Example | 75 | Ag | 100 | 70 | 8.8 | 200 | 7.3 |
| | 76 | | 40 | 15 | 3.8 | 540 | 6.2 |
| | 77 | | 500 | 15 | 5.2 | 190 | 6.9 |
| | 78 | Cu | 100 | 2 | 3.2 | 870 | 6.3 |
| | 79 | | 100 | 70 | 8.6 | 230 | 7.4 |
| | 80 | | 40 | 15 | 3.7 | 210 | 6.5 |
| | 81 | | 400 | 15 | 9.1 | 200 | 7.3 |
| | 82 | Pure Al | | 60 | 3.8 | 980 | 6.1 |

TABLE 4

| | No. | Alloy Element (ppm) | 0.2% Proof Strength (kg/mm²) | Residual Resistance Ratio | Maximum Magnetic Field (T) |
|---|---|---|---|---|---|
| Sample of Present Invention | 83 | Zn 200, Si 12 | 6.6 | 450 | 8 or more |
| | 84 | Zn 200, Si 48 | 7.4 | 280 | 8 or more |
| | 85 | Zn 200, Cu 12 | 6.3 | 400 | 8 or more |
| | 86 | Zn 200, Cu 48 | 6.8 | 320 | 8 or more |
| | 87 | Ag 200, Si 12 | 7.2 | 380 | 8 or more |
| | 88 | Ag 200, Cu 48 | 7.6 | 260 | 8 or more |
| | 89 | Ag 200, Cu 12 | 7.0 | 350 | 8 or more |
| Sample of Present Invention | 90 | Ag 200, Cu 48 | 7.4 | 255 | 8 or more |
| | 91 | Zn 200, Si 15, Cu 5 | 6.8 | 390 | 8 or more |
| | 92 | Zn 200, Si 25, Cu 20 | 7.5 | 260 | 8 or more |
| Sample of Comparative | 93 | Zn 200, Si 8 | 3.7 | 500 | 7.3 |
| | 94 | Zn 200, Si 55 | 7.7 | 230 | 7.0 |

TABLE 4-continued

| No. | | Alloy Element (ppm) | 0.2% Proof Strength (kg/mm$^2$) | Residual Resistance Ratio | Maximum Magnetic Field (T) |
|---|---|---|---|---|---|
| Example | 95 | Zn 200, | 3.8 | 490 | 6.9 |
| | 96 | Zn 200, Cu 55 | 7.8 | 220 | 7.2 |
| | 97 | Ag 200, Si 7 | 3.5 | 500 | 6.8 |
| | 98 | Ag 200, Si 52 | 7.5 | 200 | 7.1 |
| | 99 | Ag 200, Cu 8 | 3.2 | 530 | 6.4 |
| | 100 | Ag 200, Cu 53 | 7.7 | 220 | 7.5 |

As is apparent from Table 4, in any of the aluminum-stabilized superconducting wires (Nos. 83 to 92) according to the present invention, the maximum magnetic field exceeded a rated value of 8 T.

In contrast to this, in each of Comparative Examples Nos. 93, 95, 97, and 99, since the alloy element content of the aluminum member used in the aluminum stabilizing member was small, the mechanical strength was low. When such a sample was used in a magnet, the magnet was deformed when the generated magnetic field was 6 to 7 T, and heat generated by this deformation caused quenching before a predetermined current value was reached. In each of Comparative Examples Nos. 94, 96, 98, and 100, since the alloy element content of the aluminum alloy used in the aluminum stabilizing member was large, the residual resistance ratio became small, and the thermal stability and electrical stability of the conductor were degraded to cause quenching, thus degrading the magnet characteristics.

As has been described above, in each aluminum-stabilized superconducting wire according to the present invention, its aluminum stabilizing member is excellent in mechanical strength, thermal stability, and electrical stability. Therefore, when the aluminum-stabilized superconducting wire is used in a conductor for a magnet, the magnet will not be deformed by the electromagnetic force, and a strong magnetic field can be obtained. This aluminum stabilizing member can be easily fabricated by subjecting an aluminum alloy containing a small amount of alloy element, e.g., Zn, Si, Ag, Cu, or Ce to predetermined cold working.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An aluminum-stabilized superconducting wire comprising:
 a superconducting wire member comprising a superconducting filament buried in a copper matrix; and
 an aluminum stabilizing member covering an outer surface of said superconducting wire,
 said aluminum stabilizing member comprising an aluminum alloy having a 0.2% proof strength of not less than 4 kg/mm$^2$ at a very low temperature and a residual resistance ratio of not less than 250, the aluminum alloy containing at least one element selected from the group consisting of 50 to 1,000 ppm of Zn, 50 to 150 ppm of Si, 50 to 400 ppm of Ag, 50 to 300 ppm of Cu, and 30 to 2,000 ppm of Ce, and the balance being Al and inevitable impurities,
 said aluminum stabilizing member being obtained by cold working the aluminum alloy with an area reduction rate of 3 to 60%.

2. The superconducting wire according to claim 1, wherein said superconducting wire is a stranded superconducting wire obtained by twisting a plurality of resultant superconducting wires.

3. The superconducting wire according to claim 1, wherein said aluminum stabilizing member is covered on the outer circumferential surface of said superconducting wire member through a solder.

4. The superconducting wire according to claim 1, wherein the superconducting wire member is a multi-core Cu/NbTi member.

5. The superconducting wire according to claim 2, wherein the superconducting wire member comprises Cu/NbTi.

6. The superconducting wire according to claim 3, wherein the superconducting wire member comprises Cu/NbTi.

7. The superconducting wire according to claim 1, wherein the proof strength of not less than 4 kg/mm$^2$ is determined at 4.2K.

8. An aluminum-stabilized superconducting wire comprising:
 a superconducting wire member comprising a superconducting filament buried in a copper matrix; and
 an aluminum stabilizing member covering an outer surface of said superconductive wire,
 said aluminum stabilizing member comprising an aluminum alloy having a 0.2% proof strength of not less than 4 kg/m$^2$ at a very low temperature and a residual resistance ratio of not less than 250, the aluminum alloy containing at least one element selected from the group consisting of 50 to 1,000 ppm of Zn and 50 to 400 ppm of Ag; one element selected from the group consisting of 10 to 50 ppm of Si, 10 to 50 ppm of Cu and 10 to 50 ppm of Si+Cu; and the balance being Al and inevitable impurities,
 said aluminum stabilizing member being obtained by cold working the aluminum alloy with an area reduction rate of 3 to 60%.

9. The superconductor wire according to claim 8, wherein the superconducting wire member comprises Cu/NbTi.

10. The superconductor wire according to claim 8, wherein said superconducting wire is a stranded superconducting wire obtained by twisting a plurality of resultant superconducting wires.

11. The superconductor wire according to claim 10, wherein the superconducting wire member comprises Cu/NbTi.

12. The superconducting wire according to claim 8, wherein said aluminum stabilizing member is covered on the outer circumferential surface of said superconducting wire member by a solder.

13. The superconducting wire according to claim 12, wherein the superconducting wire member comprises Cu/NbTi.

14. The superconducting wire according to claim 8, wherein the proof strength of not less than 4 kg/mm$^2$ is determined at 4.2K.

* * * * *